US010797224B2

(12) United States Patent
Raghavan et al.

(10) Patent No.: US 10,797,224 B2
(45) Date of Patent: Oct. 6, 2020

(54) MAGNETORESISTIVE DEVICE AND METHOD OF FABRICATING SAME

(71) Applicants: IMEC VZW, Leuven (BE); Katholieke Universiteit Leuven, Leuven (BE)

(72) Inventors: Praveen Raghavan, Los Gatos, CA (US); Davide Francesco Crotti, Leuven (BE); Raf Appeltans, Haasrode (BE)

(73) Assignees: IMEC vzw, Leuven (BE); Katholieke Universiteit Leuven, Lueven (BE)

( * ) Notice: Subject to any disclaimer, the term of this patent is extended or adjusted under 35 U.S.C. 154(b) by 0 days.

(21) Appl. No.: 15/904,189

(22) Filed: Feb. 23, 2018

(65) Prior Publication Data
US 2018/0248111 A1    Aug. 30, 2018

(30) Foreign Application Priority Data

Feb. 24, 2017  (EP) .................................. 17157919

(51) Int. Cl.
*H01L 27/22*   (2006.01)
*H01L 43/02*   (2006.01)
(Continued)

(52) U.S. Cl.
CPC ............. *H01L 43/02* (2013.01); *G11C 5/06* (2013.01); *G11C 11/161* (2013.01);
(Continued)

(58) Field of Classification Search
CPC ........ H01L 27/222; H01L 27/228; G11C 5/06
See application file for complete search history.

(56) References Cited

U.S. PATENT DOCUMENTS 8,847,338 B2 * 9/2014 Assefa .................. H01L 27/222
257/415
9,954,030 B2 * 4/2018 Lee .......................... H01L 43/08
(Continued)

OTHER PUBLICATIONS

European Patent Office Search Report for Application EP 21088482 dated Aug. 9, 2017, 11 pages.

*Primary Examiner* — Mark V Prenty
(74) *Attorney, Agent, or Firm* — Knobbe, Martens, Olson & Bear, LLP

(57) ABSTRACT

The disclosed technology generally relates to magnetoresistive devices, and more particularly to a magnetic tunnel junction (MTJ) device formed in an interconnection structure, and to a method of integrating the (MTJ) device in the interconnection structure. According to an aspect, a device includes a first interconnection level including a first dielectric layer and a first set of conductive paths arranged in the first dielectric layer, a second interconnection level arranged on the first connection level and including a second dielectric layer and a second set of conductive paths arranged in the second dielectric layer, and a third interconnection level arranged on the second interconnection level and including a third dielectric layer and a third set of conductive paths arranged in the third dielectric layer. The device additionally includes a magnetic tunnel junction (MTJ) device including a bottom layer, a top layer and an MTJ structure arranged between the bottom layer and the top layer, wherein the bottom layer is connected to a bottom layer contact portion of the first set of conductive paths and the top layer is connected to a top layer contact portion of the second or third set of conductive paths. The device further includes a multi-level via extending through the second dielectric layer and the third dielectric layer, between a first via contact portion of the first set of conductive paths and a second via contact portion of the third set of conductive paths, wherein (Continued)

a height of the MTJ device corresponds to, or-is less than, a height of the multi-level via, e.g., wherein the height of the MTJ device corresponds to or is less than a height of the second interconnection level.

18 Claims, 5 Drawing Sheets

(51) Int. Cl.
    *G11C 5/06*     (2006.01)
    *G11C 11/16*     (2006.01)
    *H01L 43/12*     (2006.01)

(52) U.S. Cl.
    CPC ............ *H01L 27/228* (2013.01); *H01L 43/12* (2013.01); *G11C 2211/5615* (2013.01)

(56) References Cited

U.S. PATENT DOCUMENTS

| | | |
|---|---|---|
| 10,644,064 B2 * | 5/2020 | Lee .......................... H01L 43/08 |
| 2010/0193850 A1 | 8/2010 | Asao et al. |
| 2012/0217476 A1 | 8/2012 | Ikeno et al. |
| 2015/0069480 A1 | 3/2015 | Kanaya et al. |
| 2015/0263273 A1 | 9/2015 | Yoshikawa et al. |

\* cited by examiner

MAGNETORESISTIVE DEVICE AND METHOD OF FABRICATING SAME

CROSS-REFERENCE TO RELATED APPLICATIONS

This application claims foreign priority to European Patent Application No. EP 17157919.6, filed Feb. 24, 2017, the content of which is incorporated by reference herein in its entirety.

BACKGROUND

Field

The disclosed technology generally relates to magnetoresistive devices, and more particularly to a magnetic tunnel junction (MTJ) device formed in an interconnection structure, and to a method of integrating the (MTJ) device in the interconnection structure.

Description of the Related Technology

There is a growing interest in magnetoresistive random-access memory (MRAM) devices. The MRAM devices can replace or be used in conjunction with other memory devices including, e.g., dynamic random access memories (DRAMs), embedded DRAMs, static random-access memories (SRAMs) and embedded SRAMs. MRAM devices, e.g., magnetic tunnel junction (MTJ) devices, can be used as non-volatile data storage devices. The MTJ devices can be formed in an interconnection structure of the device, during the back-end-of-line (BEOL) processing. The BEOL processing typically includes forming an interconnection structure by sequentially forming a number of metallization levels. Each metallization level includes a dielectric layer and a set of conductive paths arranged in the dielectric layer. The dielectric layer electrically isolates conductive paths of adjacent metallization levels. The set of conductive paths may include lines that form horizontal electrical connections within a metallization level and vias that form vertical electrical connections between adjacent metallization levels.

In view of the ever-increasing demand for smaller and faster semiconductor devices with higher memory density, there is a need for MTJ devices having integrated therein higher density of smaller MTJs in the interconnection structure.

SUMMARY OF CERTAIN INVENTIVE ASPECTS

An objective of the present inventive concept is to enable an improvement with respect to integration of an MTJ in an interconnection structure, in particular in connection with more advanced technology nodes.

According to a first aspect of the present inventive concept there is provided a device, comprising: a first interconnection level including a first dielectric layer and a first set of conductive paths arranged in the first dielectric layer, a second interconnection level arranged on the first connection level and including a second dielectric layer and a second set of conductive paths arranged in the second dielectric layer, a third interconnection level arranged on the second interconnection level and including a third dielectric layer and a third set of conductive paths arranged in the third dielectric layer, a magnetic tunnel junction, MTJ, device including a bottom layer, a top layer and an MTJ structure arranged between the bottom layer and the top layer, wherein the bottom layer is connected to a bottom layer contact portion of the first set of conductive paths and the top layer is connected to a top layer contact portion of the second or third set of conductive paths, and a multi-level via extending through the second dielectric layer and the third dielectric layer, between a first via contact portion of the first set of conductive paths and a second via contact portion of the third set of conductive paths, wherein a height of the MTJ device corresponds to, or is less than, a height of the multi-level via, e.g., wherein the height of the MTJ device corresponds to or is less than a height of the second interconnection level.

In accordance with the first aspect, the multi-level via may extend directly between the set of conductive paths of the first and the third interconnection level, thereby electrically by-passing the set of conductive paths of the second interconnection level. More specifically, the multi-level via may extend to physically and electrically by-pass all horizontal conductive lines of the second interconnection level. Area-requiring circuitry portions formed in the second interconnection level may hence be avoided in regions adjacent to the MTJ device. More area-efficient integration of MTJ devices is thus enabled.

In particular, the multi-level via may, by extending directly between the first and the third metallization level, obviate the need for short horizontal lines or strips for interconnecting a via of a lower interconnection level and a via of an upper interconnection level.

The denomination "multi-level" via reflects that the multi-level via is arranged in both the second and the third interconnection level. In contrast, a conventional prior art "single-level" via, is arranged within only a single interconnection level.

A maximum cross-sectional dimension of the multi-level via (i.e. a dimension transverse to the vertical direction of the via) may correspond to or be less than a line width of the horizontal conductive lines of the second interconnection level.

By arranging the MTJ device with the bottom layer connected to the bottom layer contact portion of the first set of conductive paths, and further connecting the top layer of the MTJ device with the top layer contact portion of the second or third set of conductive paths, there is provided flexibility with respect to the integration of the MTJ device in the interconnection structure: The MTJ device may be formed with a height in relation to the second interconnection level, such that the MTJ device may be completely accommodated, i.e. confined, within the second interconnection level, by being of a height corresponding to, or being less than, a height of the second interconnection level.

By the MTJ device being of a height corresponding to, or less than, a height of the multi-level via, e.g., the height corresponding to or less than the height of the second interconnection level, fabrication of the overall device is facilitated. In particular, the multi-level via may protect the MTJ device during a polishing process, such as chemical mechanical polishing (CMP), which may be applied to the second interconnection level during fabrication for removing excess conductive material.

The device of the first aspect may be an electronic device. The device may be a semiconductor device. The device may be a storage device. The device may be a magneto-resistive memory.

As used herein, the term "height" of a structure denotes a dimension of the structure in a direction transverse to a main plane of extension of any of the interconnection levels, or a direction transverse to a main plane of extension of a substrate of the device. In particular, with respect to a layer or an interconnection level, the term "height" and "thickness" may be used interchangeably to refer to a same dimension.

As used herein, the term "horizontal", denotes a direction parallel to a main plane of extension of any of interconnection levels, or a direction parallel to a main plane of extension of a substrate of the device.

As used herein, the term "vertical", denotes a direction transverse to a main plane of extension of any of interconnection levels, or a direction transverse to a main plane of extension of a substrate of the device. Accordingly, the terms "above" and "below" refer to directions along the vertical direction and opposite to the vertical direction, respectively.

By interconnection level is hereby meant a level, or a tier, of an interconnection structure of the device. An interconnection level may also be referred to as a metallization level.

A first interface, or first boundary, between the first interconnection level and the second interconnection level is herein defined to coincide with a level of a topmost surface of the first set of conductive paths.

A second interface, or second boundary, between the second interconnection level and the third interconnection level is herein defined to coincide with a level of a topmost surface of the second set of conductive paths.

The first interconnection level extends from the first interface in a downward vertical direction. The second interconnection level is arranged between the first interface and the second interface. The second interconnection level extends from the second interface to the first interface. The third interconnection level extends from the second interface in an upward vertical direction.

By dielectric layer (such as the first, second and third dielectric layer) is hereby meant any layer including a material or a combination of materials such that the layer may act as an electrical isolator. A dielectric layer may be formed as a single material layer, or as a stack of sub-layers formed of different materials.

A set of conductive paths (such as the first, second and third set of conductive paths) may include a set of horizontal conductive lines or metal lines. A set of horizontal conductive lines may form horizontally extending interconnections of an interconnection level.

The horizontal conductive lines of the first interconnection level may extend in parallel to a first horizontal direction. The horizontal conductive lines of the second interconnection level may extend in parallel to a second horizontal direction which is transverse to the first horizontal direction. The horizontal conductive lines of the third interconnection level may extend in parallel to the first horizontal direction.

A set of conductive paths may further include a set of vertical conductive vias or metal vias. A vertical via may form a vertical interconnection to a below interconnection level, in particular to a set of horizontal conductive lines of the below interconnection level.

It should be noted that a via of an interconnection level may, depending on the particular process used for forming an interconnection level, be formed in a same process as a horizontal conductive line of the interconnection level, to be integrally formed with the line. A via may alternatively be formed in a different process than a horizontal conductive line of the interconnection level, to form a distinct structure arranged in contact with the line. Hence the term "via" should be understood as any vertically extending interconnection between an upper interconnection level and a lower interconnection level, the via having a lower end portion and an upper end portion, the lower end portion abutting or terminating on a topmost surface of a set of conductive paths of the lower interconnection level, the upper end portion abutting or terminating on a bottom surface of a set of conductive paths of the upper interconnection level.

The MTJ structure of the MTJ device may include a magnetic reference, fixed or pinned layer; a tunnel barrier layer; and a magnetic free layer. The reference layer and the free layer are typically ferromagnetic layers formed to present a perpendicular magnetic anisotropy (PMA) or an in-plane magnetic anisotropy. The magnetization direction of the reference layer is "fixed" or "pinned", whereas the magnetization direction of the free layer is switchable.

By "height" of the MTJ device is meant the distance between the bottom layer and the top layer of the MTJ device.

The multi-level via may include a lower via portion arranged in the second dielectric layer and an upper via portion arranged in the third dielectric layer wherein the lower via portion extends through the second dielectric layer to an interface between the second interconnection level and the third interconnection level, and wherein the upper via portion extends from the interface to the second via contact portion of the third set of conductive paths.

The height of the lower via portion may accordingly correspond to or match the height of the second interconnection level.

Thus there are no interruptions along the multi-level via, for instance in the form of short horizontal lines or strips for interconnecting the lower via portion and the upper via portion. This since the multi-level via extends continuously through (and past) the thickness portion of the second dielectric layer accommodating the horizontal conductive lines of the second interconnection level.

There is no direct electrical/galvanic contact between the lower via portion (or upper via portion) and any of the horizontal conductive lines of the second interconnection level, within the second interconnection level.

A maximum cross-sectional dimension of the lower via portion and the upper via portion (i.e. a dimension transverse to the vertical direction of the via) may correspond to or be less than a line width of the horizontal conductive lines of the second interconnection level.

This configuration of the multi-level via furthermore allows the multi-level via to be formed in a two stages. The lower via portion may be formed first, for instance in a same process as the second interconnection level. The upper via portion may be formed subsequently, for instance in a same process as forming the third interconnection level.

The height of the MTJ device may correspond to, or be less than a height of the second interconnection level. The height of the MTJ device may correspond to, or be less than, both a height of the second interconnection level and a height of the multi-level via. Fabrication of the device is thereby facilitated: The second set of conducting paths of the second interconnection level and the multi-level via may be formed in a damascene-like process. A pattern may be formed in the second dielectric layer to define positions of horizontal lines and single-level vias of the second interconnection level and a position of a lower portion of the multi-level via. The pattern may be filled with a conductive material. Excess conductive material may be removed in a polishing process, such as chemical mechanical polishing, wherein the lower via portion may protect the MTJ device from the polishing process until the desired height of the second interconnection level and the lower via portion has been obtained. A upper portion of the multi-level via may be formed as a single-level via on top of the lower portion of the multi-level via during the process for forming the conductive paths of the third interconnection level.

A top surface of the top layer of the MTJ device may be coplanar with a top surface of the second set of conductive paths. Since the multi-level via extends above the top surface of the second set of conductive paths, the above-mentioned fabrication related advantages apply correspondingly to this embodiment. Additionally, the full height of the second interconnection level may be used for the MTJ. Moreover, connecting the top layer of the MTJ with the top layer contact portion in the third interconnection level is facilitated.

Alternatively, a height of the MTJ device may correspond to, or be less than, a height of a (single-level) via of the second interconnection level. In other words, the top surface of the top layer of the MTJ device may be coplanar with, or be arranged at a level below, a bottom surface of a horizontal line of the second interconnection level. This may further protect the MTJ device during forming of the second interconnection level. In this case, the top layer of the MTJ device may be connected to a top layer contact portion in the second interconnection level.

The top contact portion may be formed by a line of the second interconnection level (in case the MTJ device has a height corresponding to a height of a single-level via of the second interconnection level) or by a via extending downwardly through the second dielectric layer to abut the top layer of the MTJ device (in case the MTJ device has a height less than a height of a single-level via of the second interconnection level).

The bottom layer contact portion may be formed by a line segment of the first set of conductive paths, the line segment being arranged on a via of the first set of conductive paths. This allows the MTJ device to be formed subsequent to completing processing of the first metallization level.

By arranging the bottom layer of the MTJ device in abutment with the line segment-shaped bottom layer contact portion, no additional vertical interconnects are needed between the bottom layer and the first set of conductive paths of the first interconnection level.

The top layer contact portion may be formed by a via of the third set of conductive paths, the via being arranged below a line of the third set of conductive paths. This allows the MTJ device to be conveniently connected to the third set of conductive paths of the third interconnection level by aligning a single-level via of the third interconnection level with the top layer of the MTJ device.

By arranging the top layer of the MTJ device in abutment with the via top layer contact portion, no additional vertical interconnects are needed between the top layer and the third set of conductive paths of the third interconnection level.

The first via contact portion may be formed by a line segment of the first set of conductive paths, the line segment being arranged on a via of the first set of conductive paths. This allows the multi-level via to be formed subsequent to completing processing of the first metallization level.

By arranging a lower via portion of the multi-level via in abutment with the line segment first via contact portion, the lower via portion may be formed in a same process as the second interconnection level. Also, no additional interconnects are needed between the lower via portion and the first set of conductive paths of the first interconnection level.

The second via contact portion may be formed by a line segment of the third set of conductive paths. The line segment may be formed above single-level vias of the third interconnection level.

By arranging an upper via portion of the multi-level via in abutment with the line segment second via contact portion, the upper via portion may be formed in a same process, or at least in a same manner, as single-level vias of the third interconnection level. Also, no additional vertical interconnects are needed between the upper via portion and the third set of conductive paths of the third interconnection level.

The device may further comprise an access transistor having a drain contact connected to the bottom layer of the MTJ device by means of, i.e. through, the bottom layer contact portion, and a source contact connected to the multi-level via by means of the first via contact portion. This configuration allows write and read currents to be selectively applied to the MTJ device by controlling the access transistor. Thus, integration of the MTJ in a memory cell of a memory array is enabled.

The bottom layer of the MTJ device may accordingly, through the access transistor, be switchably connected to the multi-level via, which in turn may be connected to a source line arranged in the third interconnection level. Since the conductive lines of the third interconnection level may be arranged at a level above the MTJ device, the source line may be designed in a manner providing desired electrical properties, while ensuring a sufficient physical separation between the MTJ device and the source line.

The top layer contact portion may be connected to a bit line of the third set of conductive paths. Accordingly the top layer of the MTJ device may be electrically connected to a bit line. Currents may hence be selectively conducted through the MTJ device, between the source line and the bit line, by controlling the access transistor.

Since the conductive lines of the third interconnection level may be arranged at a level above the MTJ device, the bit line may be designed in a manner providing desired electrical properties, while ensuring a sufficient physical separation between the MTJ device and the bit line.

According to one embodiment, the MTJ device forms a first MTJ device, and the device further comprises a second MTJ device including a bottom layer, a top layer and an MTJ structure arranged between the bottom layer and the top layer, wherein the bottom layer of the first MTJ device and the bottom layer of the second MTJ device each is connected to the multi-level via by means of a respective access transistor.

The multi-level via may hence be shared by two (or more) MTJ devices. A total number of vertical interconnections may hence be limited.

The second MTJ device may be arranged in a corresponding manner as the first MTJ device. Accordingly the above description relating to the first MTJ device applies correspondingly to the second MTJ device.

Accordingly, the bottom layer of the first MTJ device may be arranged on the (first) bottom layer contact portion of the first set of conductive paths and the top layer of the first MTJ device may be connected to the (first) top layer contact portion of the second or third set of conductive paths. Correspondingly, the bottom layer of the second MTJ device may be arranged on a (second) bottom layer contact portion of the first set of conductive paths and the top layer of the second MTJ device may be connected to a (second) top layer contact portion of the second or third set of conductive paths.

The first bottom layer contact portion and the second bottom layer contact portion may be formed by a respective first and second discrete line segment of the first set of conductive paths. The first line segment and the second line segment may be arranged on a respective via of the first set of conductive paths.

The first bottom layer contact portion and the second bottom layer contact portion may be galvanically disconnected from each other. In other words, no direct galvanic connections between the first and second bottom layer contact portions are needed in the first interconnection level.

The first top layer contact portion and the second top layer contact portion may be formed by a respective first and second line segment of the third set of conductive paths. Especially, the first and second line segment of the third set of conductive paths may form segments along a same line of the third set of conductive paths.

Alternatively, the first top layer contact portion and the second top layer contact portion may be arranged in the second interconnection level. The respective top contact portions may be formed by a respective via extending downwardly through the second dielectric layer to abut the top layers of the MTJ devices.

The first via contact portion may be formed by a line segment of a first source line of the first set of conductive paths of the first interconnection level and the second via contact portion may be formed by a line segment of a second source line of the third set of conductive paths of the third interconnection level.

Thus, the lower level first source line may be tapped to the higher level second source line. This provides a design flexibility in that the first source line, which is arranged at a level below the MTJ devices, may be designed in a different manner than the second source line, which is arranged at a level above the MTJ devices.

The device may comprise a plurality of mutually parallel first source lines of the first set of conductive paths, wherein the first MTJ device and the second MTJ device are arranged between a pair of the first source lines, and wherein the multi-level via is arranged at a position, along one of the source lines, between the first MTJ device and the second MTJ device.

By the multi-level via being displaced in relation to a straight line path between the first and second MTJ devices, a separation between the multi-level via and the MTJs may be increased, thereby improving electrical isolation between the MTJ devices and the multi-level via. At a same time a separation between the MTJ devices may be decreased, thereby improving the area efficiency.

The device may include an active device layer. The first interconnection level may be a lower most interconnection level, formed on the active device layer. The set of conductive paths of the first interconnection level may be formed with a reduced pitch compared to the set of conductive paths of the second and the third interconnection level.

The first set of conductive paths may include a first metal and the second and third set of conductive paths may include a second metal which is different from the first metal. Thereby, a first metal which facilitates forming of reduced pitch interconnections may be used in the first interconnection level. Meanwhile, a second metal having a higher conductivity may be used for relaxed pitch interconnections in the second and third interconnection levels.

The first metal may include Co, W or Ru. Such metals provide good filling properties, facilitating forming of reduced pitch interconnections, albeit at a cost of a lower conductivity. The second metal may include Cu or Al. Such metals facilitate forming of high-conductivity interconnections.

The design of the inventive device of the first aspect, allows longer electrical paths to be routed in the third interconnection level (which may be formed to present desirable electrical properties), and locally supplied by means of the multi-level via, down to the first interconnection level (which may be formed to present desirable reduced dimensions).

According to a second aspect, there is provided a method of integrating a magnetic tunnel junction, MTJ, device in an interconnection structure of a device, comprising: on a bottom layer contact portion of a first set of conductive paths of a first interconnection level, forming an MTJ device including: a bottom layer, a top layer and an MTJ structure arranged between the bottom layer and the top layer, filling, with a conductive material, a pattern in a dielectric layer portion arranged on a first portion of the first interconnection level, the pattern defining positions of a second set of conductive paths of a second interconnection level, filling, with a conductive material, a hole in a dielectric layer portion arranged on a second portion of the first interconnection level, the hole defining a position of a lower via portion of a multi-level via, wherein the hole is formed above a first via contact portion of the first set of conductive paths, performing a polishing process, thereby reducing a thickness of the dielectric layer portions such that a topmost surface of the conductive material filling the pattern and the hole becomes arranged above or coplanar with a top surface of the top layer of the MTJ device, and forming a third set of conductive paths of a third interconnection level, the forming of the third set of conductive paths including forming an upper via portion on the lower via portion, the lower via portion and the upper via portion together constituting or forming the multi-level via.

By the inventive method, an MTJ may be integrated in an interconnection structure and second and third interconnection levels may be formed with a reduced risk of damaging the MTJ. More specifically, by reducing a thickness of the dielectric layer portions on the first and second portions of the first interconnection level simultaneously, the presence of the structure which is to form the lower via portion of the multi-level via protects the MTJ.

The forming of the upper via portion may include forming a hole in a dielectric layer, the hole exposing a topmost surface of the lower via portion, and filling the hole with a conductive material. The final multi-level via may hence be conveniently formed in two stages, wherein the upper via portion may be formed in a same process as forming the lines and further vias of the third interconnection level.

The further discussion of advantages and details with respect to the first aspect apply correspondingly to the second method aspect. Reference is therefore made to the above.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1:
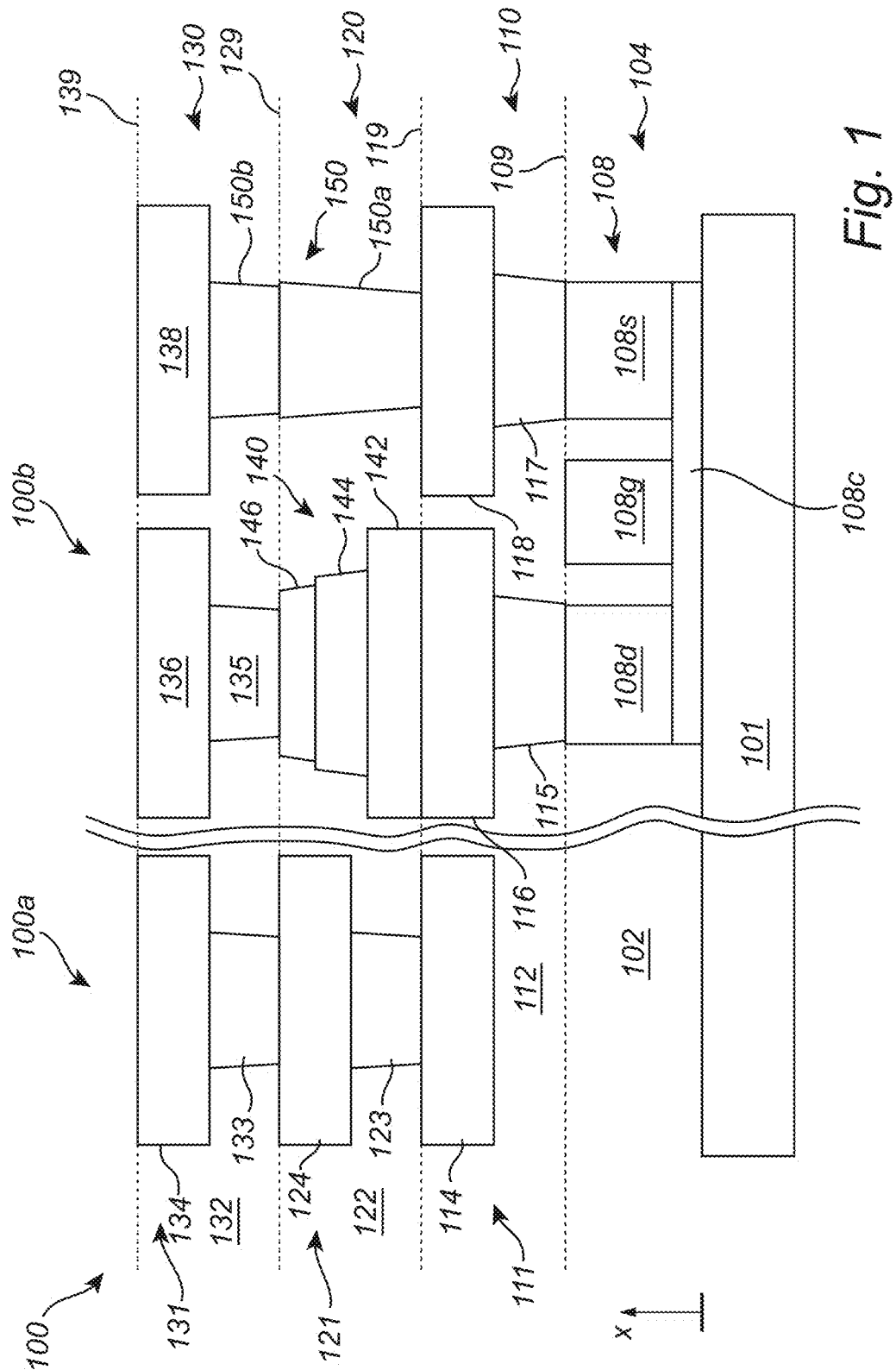
FIG. 1 is a schematic illustration of a cross-section of an example magnetoresistive device.

With reference to FIG. 1, there is schematically shown a cross-sectional side view of a semiconductor structure or device 100. It is noted that owing to the schematic nature of the drawings, the relative dimensions of the various structures and layers is not drawn to scale. Rather, the dimensions have been adapted for illustrational clarity and to facilitate understanding of the following description.

The device 100 includes a semiconductor wafer or substrate 101. Examples of semiconductor substrates include a Si substrate, a Ge substrate, a SiGe substrate, a SiC substrate, a SOI substrate, a GeOI substrate or a SiGeOI substrate, to name a few.

In FIG. 1, the vertical direction of the device 100, which corresponds to the normal direction to the main surface of the substrate 101, is indicated as an x-direction.

An active device layer 104 including active devices is arranged on a main surface of the substrate 101. The active devices may be formed in a semiconductor layer of the substrate 101. The active devices are arranged in a dielectric layer 102 of the active device layer 104. The active devices may include various semiconductor devices including transistors. The transistors include, among others, an access transistor 108, used for reading and writing of MTJs of the device 100. The active device layer 104 may be formed using suitable front-end-of-line (FEOL) processes. The active device layer 104 may interchangeably be referred to as a FEOL-portion 102 of the device 100.

As described herein, a metallization level includes a dielectric layer and a set of conductive paths arranged in the dielectric layer. The set of conductive paths within the metallization level includes horizontal electrical connections, e.g., lines, and vertical electrical connections, e.g., vias that electrically connect adjacent metallization levels. The dielectric layer electrically isolates the horizontal electrical connections and the vertical electrical connections. In the illustrated embodiment of FIG. 1, a first interconnection level 110 is arranged on the active device layer 104. A second interconnection level 120 is arranged on the first interconnection level 110. A third interconnection level 130 is arranged on the second interconnection layer 120. The first through third interconnection levels 110, 120, 130 form part of an interconnection structure, or BEOL-portion, of the device 100. While three interconnection levels 110, 120, 130 are illustrated as part of the device 100, embodiments are not so limited and in other embodiments, the device 100 may include fewer, e.g., one or two, or greater, e.g., four or greater, interconnection levels.

An interface between the active device layer 104 and the first interconnection level 110 is indicated by the dashed line 109. An interface between the first interconnection level 110 and the second interconnection level 120 is indicated by the dashed line 119. An interface between the second interconnection level 120 and the third interconnection level 130 is indicated by the dashed line 129.

A height of the first interconnection level 110 is given by a vertical distance between the interface 109 and the interface 119. A height of the second interconnection level 120 is given by a vertical distance between the interface 119 and the interface 129. A height of the third interconnection level 120 is given by a vertical distance between the interface 129 and the topmost surface of the third interconnection level 130, as indicated by the dashed line 139.

The first interconnection level 110 includes a first dielectric layer 112. The first dielectric layer 102 is arranged on an upper surface of the active device layer 104. A first set of conductive paths 111 are arranged in the first dielectric layer 112. The first set of conductive paths 111 includes a set of horizontal conductive lines or metal lines and a set of vertical vias. Some of the vertical vias and the horizontal conductive lines of the first set of conductive paths 111 directly contact each other such that they form immediately vertically adjacent vertical vias and horizontal conductive lines.

The second interconnection level 120 includes a second dielectric layer 122. The second dielectric layer 122 is arranged on an upper surface of the first interconnection level 110. A second set of conductive paths 121 are arranged in the second dielectric layer 122. The second set of conductive paths 121 includes a set of horizontal conductive lines or metal lines and a set of vertical vias. Some of the vertical vias and the horizontal conductive lines of the second set of conductive paths 121 directly contact each other such that they form immediately vertically adjacent vertical vias and horizontal conductive lines.

The third interconnection level 130 includes a third dielectric layer 132. The third dielectric layer 132 is arranged on an upper surface of the second interconnection level 120. A third set of conductive paths 131 are arranged in the third dielectric layer 132. The third set of conductive paths 131 includes a set of horizontal conductive lines or metal lines and a set of vertical vias. Some of the vertical vias and the horizontal conductive lines of the third set of conductive paths 131 directly contact each other such that they form immediately vertically adjacent vertical vias and horizontal conductive lines.

The dielectric layers 102, 112, 122, 132 of the respective levels 104, 110, 120, 130 may each include a layer of silicon dioxide or some other low-κ material. Although not shown in FIG. 1, each dielectric layer may also include a stack of sub-layers of different dielectric materials.

The first set of conductive paths 111 may be formed with a line density or pitch as dictated by the critical dimensions and density of the active devices of the active device layer 104. For some state-of-the-art technology nodes, e.g., advanced technology nodes such as 28 nm and below, for instance 10 nm or 7 nm, it may therefore be advantageous to form the first set of conductive paths 111 of a material having good filling properties. Co, W, Ru, or combinations thereof represent examples of such materials.

The second and third sets of conductive paths 121, 131 may, by providing the first interconnection level 110 with an appropriate design, be formed with a relaxed line density or pitch. Thus, materials facilitating forming of high-conductivity interconnections may be used to form the second and third sets of conductive paths 121, 131. Cu, Al, or combinations thereof represent examples of such materials.

As indicated in FIG. 1, the device 100 may include two physically separated parts or regions 100a, 100b. The region 100a may include active devices and interconnections for forming logic and/or I/O circuitry of the device 100. The region 100b may include a memory area with plurality of memory cells including MTJs (as will be described in more detail below).

Advantageously, in the region 100a, the second set of conductive paths 121 of the second interconnection level 120 may include conventional single-level vias (in FIG. 1 represented by via 123) and horizontal lines (in FIG. 1 represented by line 124). Meanwhile, in the region 100b, the second set of conductive paths 121 of the second interconnection level 120 may include mainly, or only, conductive paths in the form of multi-level vias (as will be described in more detail below).

The device 100 includes a magnetic tunnel junction (MTJ) device 140. The MTJ device 140 includes a bottom electrode 142 forming a bottom layer of the MTJ device 140, a top electrode 146 forming a top layer of the MTJ device 140 and an MTJ structure 144 arranged between the bottom electrode 142 and the top electrode 146.

Although in the following, the bottom and top layers of the MTJ device 140 are formed by a bottom and top electrode, respectively, it is contemplated that MTJ devices 140 not including dedicated bottom and top electrodes also may be integrated in the interconnection structure of the present device 100. Hence, throughout the following description, any reference to a bottom electrode may be construed as a reference to a bottom layer of the MTJ device. Any reference to a top electrode may be construed as a reference to a top layer of the MTJ device. Correspondingly, any reference to a bottom or top electrode contact portion may be construed as a reference to a bottom or top layer contact portion.

The bottom electrode 142 forms a lower-most layer of the MTJ device 140. The top electrode 146 forms a topmost layer of the MTJ device 140.

A height of the MTJ device 140 matches the vertical distance between the bottom surface of the bottom electrode 142 and the topmost surface of the top electrode 146.

As shown in FIG. 1, the height of the MTJ device 140 corresponds to, or is substantially similar to, the height of the second interconnection level 121. The topmost surface of the top electrode 146 is coplanar with the topmost surface of the line 124 of the second set of conductive paths 121. The topmost surface of the top electrode 146 is also coplanar with the interface 129 between the second and third interconnection levels 120, 130. As an alternative to the illustrated MTJ device 140, the MTJ device 140 may be formed with a height which is less than a height of the second interconnection level 120. The MTJ device 140 may even be formed with a height which corresponds to, or is less than a height of the via 123.

With continued reference to FIG. 1, the MTJ structure 144 is formed on the bottom electrode 142. The MTJ structure 144 may include a reference layer and a free layer, separated by a tunnel barrier layer. The reference layer, the magnetic free layer and the tunnel barrier layer may be formed using suitable techniques, e.g., using physical vapor deposition.

In some embodiments, The MTJ structure 144 may include a top-pinned MTJ structure wherein the magnetization direction of the reference layer is pinned by a magnetic pinning layer arranged above the reference layer. In some other embodiments, the MTJ structure 144 may be bottom-pinned, wherein the magnetization direction of the reference layer is pinned by a magnetic pinning layer arranged below the reference layer.

In the MTJ structure 144, a relative orientation of the magnetization directions of the reference layer and the free layer determines an electric resistance of the MTJ structure 144. The MTJ structure 144 may present a relatively low resistance when the magnetization of the reference layer and the free layer are aligned or parallel and a relatively high resistance when the magnetization directions of the reference layer and the free layer are anti-parallel with respect to each other. In some embodiments, the directions of magnetization in the reference layer and the free layer are perpendicular to the plane of the reference layer and the free layer, which configuration may be referred to as perpendicular MTJs. In some other embodiments, the directions of magnetization in the reference layer and the free layer are parallel to the plane of the reference layer and the free layer, which configuration may be referred to as parallel MTJs.

The tunnel magneto-resistance ratio (TMR) is a measure of the difference in the resistance to a current conducted vertically through the MTJ structure 144, between the anti-parallel state and the parallel state. The different states of the free layer, and accordingly the different resistance levels, may be used to represent either a logic "1" or a logic "0". A reading operation of the MTJ device 140 may be performed by measuring a resistance of the MTJ device 140 to a "read current" passed through the MTJ device 140.

A writing operation of the MTJ device 140 generally involves changing/switching the magnetization direction of the free layer between the parallel and the anti-parallel states. The free layer magnetization direction may be controlled by a spin-torque transfer (STT) effect wherein the magnetization direction is changed by passing a relatively high current through the MTJ device, perpendicular to the layers forming the MTJ structure 144. The high current may be substantially spin polarized and quantum-mechanically tunneled through the barrier layer interposed between the free layer and the reference layer.

The bottom electrode 142 is arranged above, and galvanically connected to, a drain contact 108d of the access transistor 108. The bottom electrode 142 is arranged on a bottom electrode contact portion 116 of the first set of conductive paths 111. The bottom electrode contact portion 116 is formed by a line segment 116 of the first set of conductive paths 111. The line segment 116 is arranged on a via 115 of the first set of conductive paths 111. The via 115 extends from the line segment 116 to the drain contact 108d. As shown, the via 115 terminates or ends at the interface 109.

The top electrode 146 is arranged below, and galvanically connected to, a line segment 136 of the third set of conductive paths 131. The top electrode 146 is arranged in abutment with a top electrode contact portion 135. The top electrode contact portion 135 is formed by a via 135 of the third set of conductive paths 131. The via 135 extends from the line 136 to the top electrode 146. As shown, the via 135 terminates or ends at the interface 129.

In certain embodiments, the region 100b of device 100 includes an array of memory cells, where each of the memory cells may be selected for a read operation or a write operation. The operation is performed by selecting a combination of a bit line electrically connected to a drain contact 108d and a word line electrically connected to a gate contact 108g of the access transistor 108. Each memory cell has an MTJ device 140 electrically connected to a bit line. In the illustrated embodiment, the line segment 136 forms part of a bit line of the third interconnection level 130. The line segment and the bit line of the third interconnection level 130 is be commonly referenced by reference sign 136.

If the MTJ device 140 is formed with a height which is less than a height of the second interconnection level 120, or less than a height of the via 123, a top electrode contact portion may be formed by extending the via 135 into the second interconnection level 120, into abutment with the top electrode 146. The portion of such an extended via 135 extending into the second interconnection level 120 may thus form a top electrode contact portion of the second interconnection level 120.

The device 100 further includes a multi-level via 150. The multi-level via 150 extends through the second dielectric layer 120 and the third dielectric layer 130. The multi-level via 150 extends between a first line segment 118 of the first set of conductive paths 111 and a line segment 138 of the third set of conductive paths 131. The line segment 118 forms a first via contact portion 118. The line segment 138 forms a second via contact portion 138. The multi-level via 150 may thus extend to physically and electrically by-pass all horizontal conductive lines of the second interconnection level 120. Thus, there is no direct electrical/galvanic contact between the multi-level via 150 and any of the horizontal conductive lines of the second interconnection level 120, within the second interconnection level 120. In other words, the multi-level via 150 is electrically isolated from all horizontal conductive lines of the second interconnection level 120.

The multi-level via 150 includes a lower via portion 150a arranged in the second dielectric layer 120. The multi-level via includes an upper via portion 150b arranged in the third dielectric layer 130. The upper via portion 150b represents the portion of the multi-level via 150 which extends above the interface 129.

The lower via portion 150a extends through the second dielectric layer 120 to the interface 129 between the second and the third interconnection levels 120, 130. The lower via portion 150a extends continuously through the thickness portion of the second dielectric layer 122 accommodating the horizontal conductive lines of the second interconnection level 120. In the illustrated embodiment, the lower via portion 150a continuously extends through the entire thickness of the second interconnection level 120. The upper via portion 150b extends from the interface 129 to the second via contact portion 138 of the third set of conductive paths 131.

As illustrated in FIG. 1, in some embodiments, the MTJ device 140 has a height which corresponds to a height of the lower via portion 150a. The total height of the multi-level via 150 is the combined height of the lower via portion 150a and the upper via portion 150b. Consequently, the MTJ device 140 has a height which is less than a total height of the multi-level via 150.

In the illustrated embodiment, the multi-level via 150 has a total height which is greater than a height of the second interconnection level 120.

In some embodiments, a maximum cross-sectional dimension of the lower via portion 150a and the upper via portion 150b (i.e. a dimension transverse to the vertical direction of the via) corresponds to, but is advantageously less than, a line width of the horizontal conductive lines 124 of the second interconnection level 120. A lateral footprint of the memory cell may be kept relatively small by not having the multi-level via 150 contact a horizontal conductive line 124 of the second interconnection level 120.

The lower via portion 150a is arranged above, and galvanically connected to, a source contact 108s of the access transistor 108. The lower via portion 150a is arranged on the first via contact portion or line segment 118. The line segment 118 is arranged on a via 117 of the first set of conductive paths 111. The via 117 extends from the line segment 118 to the source contact 108s. As shown, the via 117 terminates or ends at the interface 109.

The upper via portion 150b is arranged below, and galvanically connected to, the second via contact portion or line segment 138. The upper via portion 150b is arranged in abutment with the line segment 138.

The line segment 138 may form part of a source line of the third interconnection level 130. The line segment, the second via contact portion and the source line of the third interconnection level 130 may be commonly referenced by reference sign 138.

The access transistor 108 is configured to provide a read current or a write current to the MTJ device 140 by controlling the switching state of the access transistor 108. By switching the access transistor 108 to an on-state a current may be conducted between the line segment 138 (which as mentioned above may form part of a source line) and the line segment 136 (which as mentioned above may form part of a bit line). Read and write currents may thereby be selectively applied to the MTJ device 140.

The access transistor 108 may be a planar device or a non-planar device. The access transistor 108 may be for instance a MOSFET, a MISFET, a BJT, a JBT, a FinFET, or a nanowire FET to name a few.

The access transistor 108 includes a channel structure 108c. The drain contact 108d is arranged on a drain region of the access transistor 108. The source contact 108s is arranged on a source region of the access transistor 108.

The access transistor 108 includes a gate electrode 108g arranged on the channel structure 108c. The gate electrode 108g may be connected to a (not shown) line arranged in the second interconnection level 120, the third interconnection level 130, or in a (not shown) fourth interconnection level arranged above the third interconnection level 130.

In FIG. 1, the various elements and structures of the device 100 are for illustrational purposes displaced to be arranged in a same vertical viewing plane, for the purpose of illustrating vertical aspects of the device 100. In a physical device, the horizontal conductive lines (e.g. 134, 136, 138) of the third interconnection level may be arranged in a same horizontal plane and extend in parallel to each other in a first horizontal direction. The horizontal conductive lines (e.g. 124) of the second interconnection level may be arranged in a same horizontal plane and extend in parallel to each other in a second horizontal direction, which is perpendicular to the first horizontal direction. The horizontal conductive lines (e.g. 114, 116, 118) of the first interconnection level may be arranged in a same horizontal plane and extend in parallel to each other in the first horizontal direction. Thus, the horizontal lines of the first and third interconnection level (e.g. 114, 116, 118, 134, 136, 138) may have a longitudinal direction which is parallel to the viewing plane in FIG. 1. The horizontal lines of the second interconnection level (e.g. 124) may have a longitudinal direction which is oriented perpendicular to the viewing plane in FIG. 1.

Figure 2:
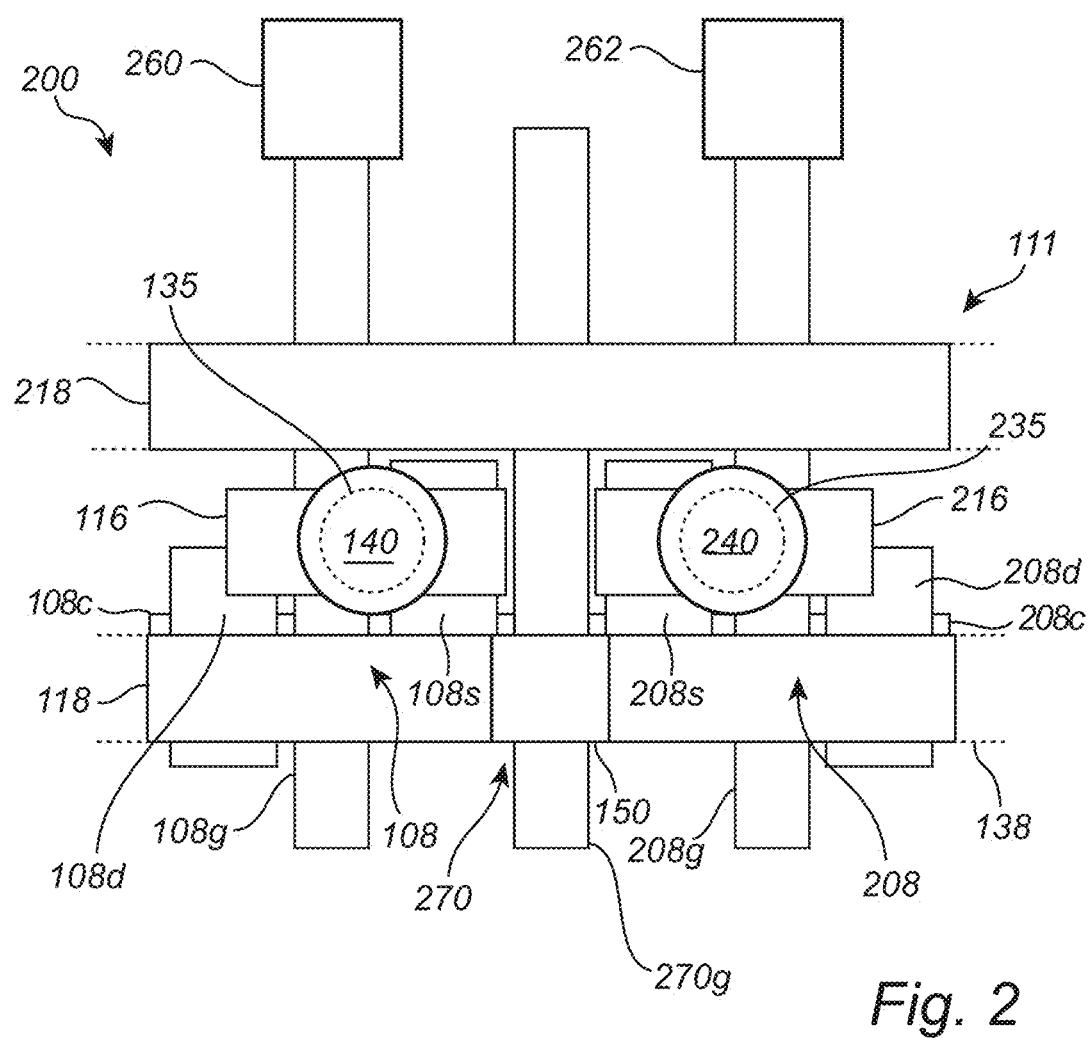
FIG. 2 is a schematic illustration of a top-view of the magnetoresistive device illustrated in FIG. 1.

Such a configuration may be seen in FIG. 2 which is a schematic illustration of a top-view of a device 200. Like reference numerals in FIG. 1 and FIG. 2 correspond to like elements. The description of corresponding elements will therefore not be repeated.

The device 200 includes, in addition to the (first) MTJ device 140, a (second) MTJ device 240. The MTJ device 140 may form part of a first memory cell or bit cell. The MTJ device 240 may form part of a second memory cell or bit cell.

In FIG. 2, at least portions of the second and third interconnection levels 120, 130 have been omitted to allow an unobstructed view of the MTJ devices 140 and 240, the multi-level via 150, and the relevant portions of the first interconnection level 110 and the active device level 104.

The MTJ device 240 includes a bottom electrode (corresponding to the bottom electrode 142), a top electrode (corresponding to the top electrode 146) and an MTJ structure (corresponding to the MTJ structure 144) arranged between the bottom electrode and the top electrode.

The bottom electrode of the MTJ device 140 and the bottom electrode of the MTJ device 240 are both connected to the multi-level via 150 by means of a respective access transistor 108 and 208.

The access transistor 108 and 208 include corresponding elements. The access transistor 208 includes a channel structure 208c (in FIG. 2 running below, and partially hidden by the line 118). A drain contact 208d is arranged on a drain region of the access transistor 208. A source contact 208s is arranged on a source region of the access transistor 108.

The gate electrodes 108g and 208g of the access transistors 108 and 208, respectively, are extended towards a respective gate contact 260, 262. The gate contacts 260, 262 extend in parallel to each other, in a direction transverse to a longitudinal direction of the lines of the first set of conductive paths 111.

The gate contacts 260, 262 may be connected to a (not shown) word line arranged in the second interconnection level 120, the third interconnection level 130, or in a (not shown) fourth interconnection level arranged above the third interconnection level 130. The gate contacts 260, 262 and the word line may be interconnected by means of vias and lines of the set of conductive paths of the intermediate interconnection level. As shown, the gate contacts 260, 262 may be arranged at a location outside of the bit cells. The impact of the interconnections between the gate contacts 260, 262 on the layout and spacing of the bit cells may thus be minimized or at least reduced.

Similar to the bottom electrode 142 of the MTJ device 140, the bottom electrode of the MTJ device 240 is arranged on a bottom electrode contact portion formed by a line segment 216 of the first set of conductive paths 111. As shown in FIG. 2, the line segments 116 and 216 are physically separated from each other. The line segment 216 is arranged on a via (which is hidden from view in FIG. 2) of the first set of conductive paths 111, corresponding to the via 115. The via extends from the line segment 216 to the drain contact 208d of the access transistor 208.

Similar to the top electrode 146 of the MTJ device 140, the top electrode of the MTJ device 240 is arranged below, and galvanically connected to, a (not shown) line segment of the third set of conductive paths 131. The top electrode is arranged in abutment with a top electrode contact portion formed by a via 235 of the third set of conductive paths 131. In FIG. 2, the positions of the via 135 and the via 235 are schematically indicated by a respective dashed circle aligned with the respective MTJ device 140, 240.

The via 135 and 235 extends from a common line, forming a bit line of the third set of conductive paths, to the respective top electrodes.

With reference to FIG. 2, the first via contact portion which the lower via portion 150a of the multi-level via 150 is arranged in abutment with is formed by a line segment or portion along the source line 118 of the first set of conductive paths 111. The second via contact portion which the upper via portion 150b of the multi-level via 150 is arranged in abutment with is formed by a line segment or portion along the source line 138 (indicated by dashed lines) of the third set of conductive paths of the third interconnection level. The source line 118 and the source line 138 may be referred to as a first level source line 118 and a third level source line 138.

The device 200 comprises a plurality of parallel first level source lines 118, 218 of the first set of conductive paths 111. The first level source line 118 and the first level source line 218 form a pair of adjacent first level source lines. The MTJ device 140 and the MTJ device 240 are arranged between the pair of first level source lines. The multi-level via 150 is arranged at a position, along the first level source line 118, between the first MTJ device 140 and the second MTJ device 240. The positions, within a horizontal plane, of the first MTJ device 140, the second MTJ device 240 and the multi-level via may represent vertices of an isosceles triangle, i.e. a triangle having at least two sides of equal length.

The multi-level via 150 obviates the need for a short line segment or strip in the second interconnection level, for interconnecting a conventional single-level via in the second interconnection level with a conventional single-level via in the third interconnection level. Such a line segment would in the configuration in FIG. 2 extend into the space between the MTJ devices 140, 240. The multi-level via 150 hence allows a horizontal distance between the MTJ devices 140, 240 and conductive lines of the second interconnection level to be increased. Conversely, a closer arrangement of the MTJ devices 140, 240 and the multi-level via 150 is allowed.

As indicated in FIG. 2 the device 200 may further include a dummy transistor 270. The dummy transistor is arranged between the access transistor associated with the MTJ device 140 and the access transistor associated with the MTJ device 240. The dummy transistor 270 is common to the first and the second bit cell. The dummy transistor includes a dummy gate 270g extending in parallel to and between the gate electrodes 108g, 208g. The dummy gate 270g is biased such that the there is no direct current conduction between the bottom electrode contact portions 116, 216.

A configuration of the bit cells including such a dummy transistor 270 may be referred to as a dummy poly cell configuration. It should however be noted that also other configurations are possible, such as two finger cell configurations or DRAM-style cell configurations.

Figure 3A:
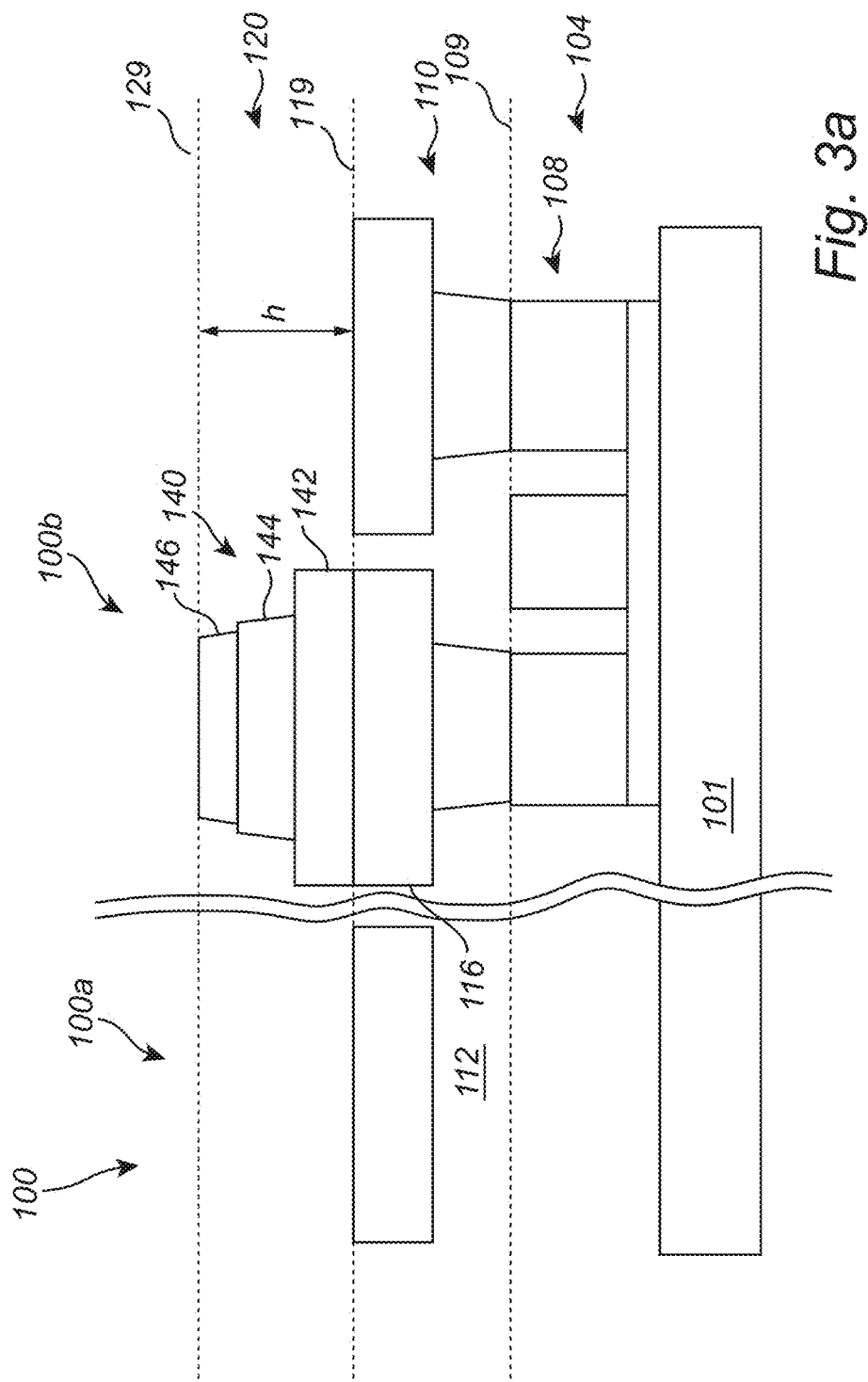
FIGS. 3a-3c schematically illustrate intermediate structures at various stages of integrating an MTJ device in an interconnection structure of a magnetoresistive device.
Figure 3B:
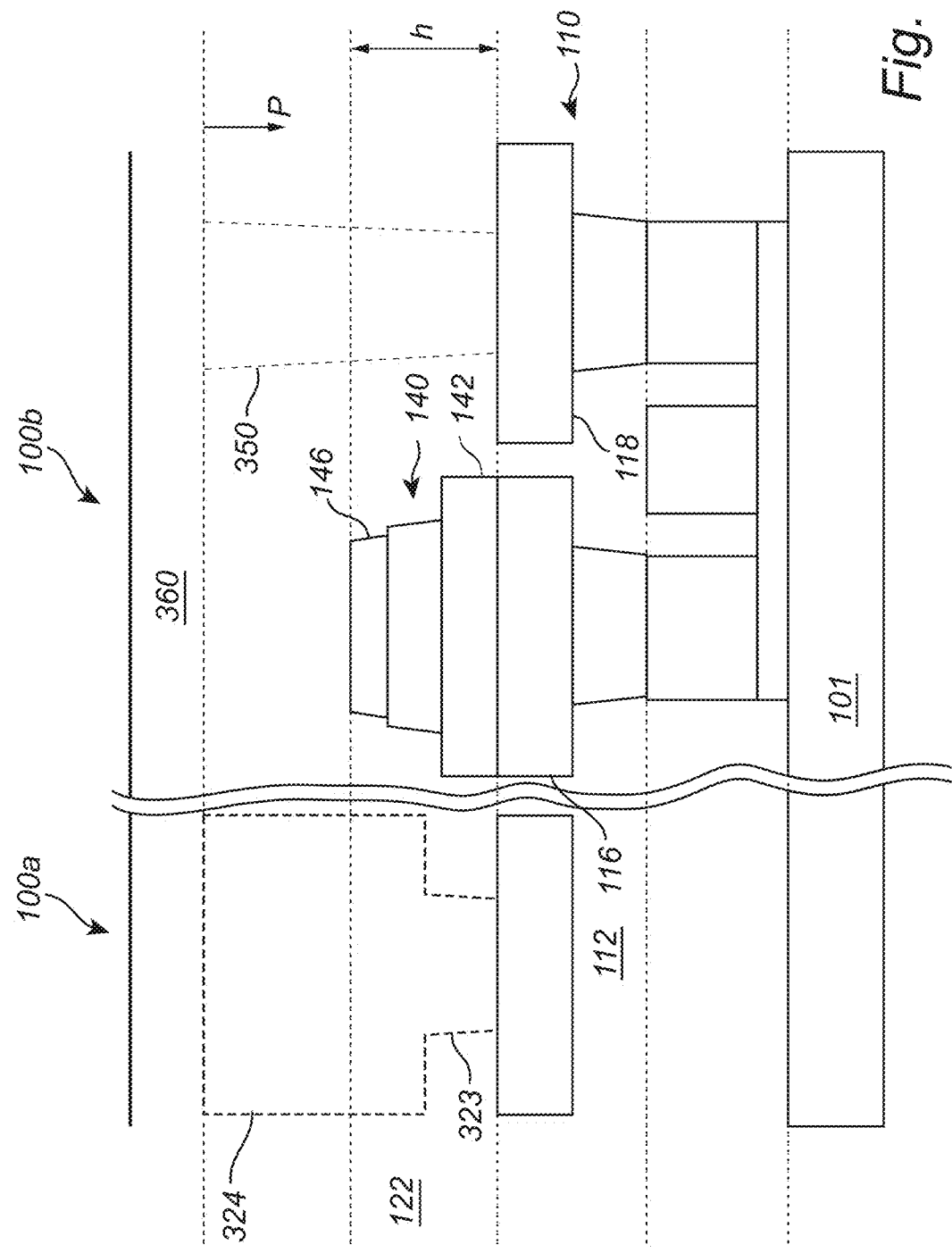
Figure 3C:
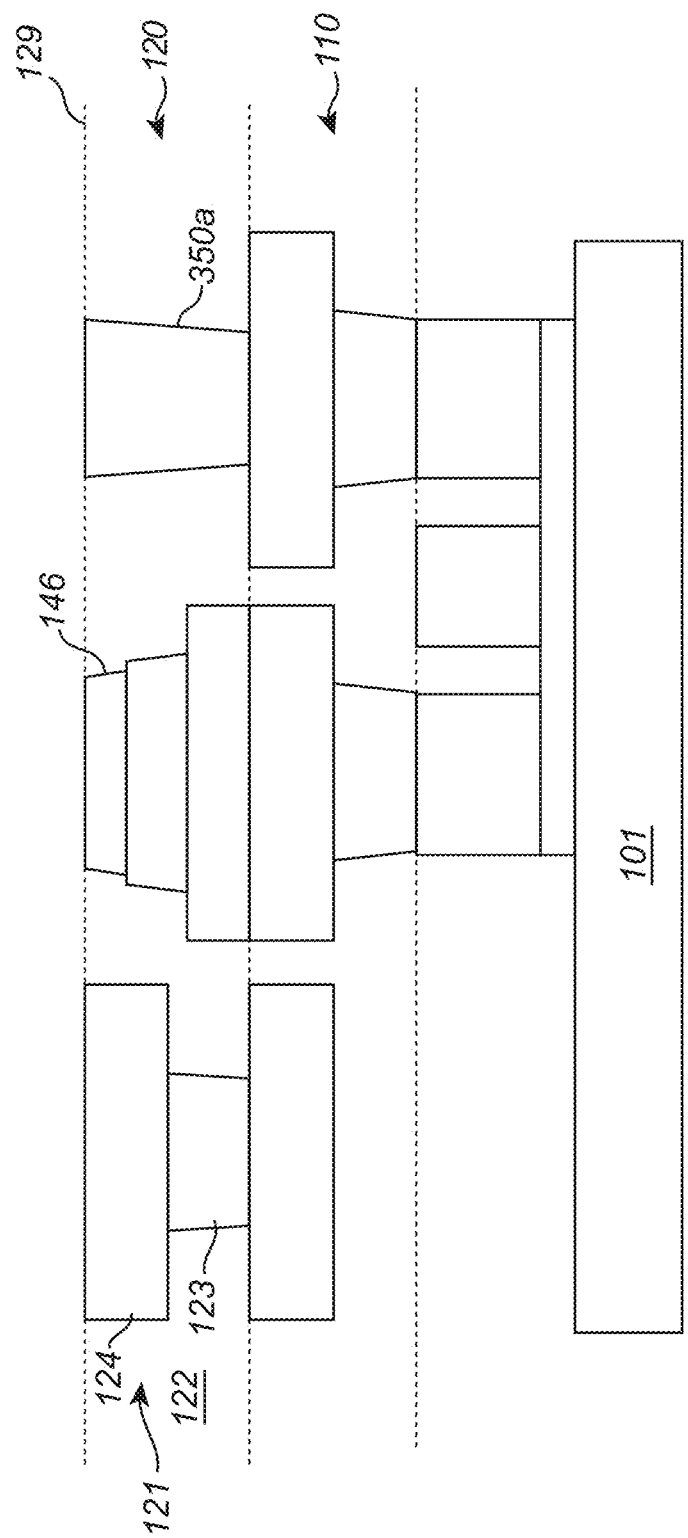

FIGS. 3a-3c illustrate a method of integrating an MTJ device in an interconnection structure of a device. Like reference numerals in FIG. 1 and FIG. 3 correspond to like elements. The description of corresponding elements will therefore not be repeated.

With reference to FIG. 3a, the active device level 104 has been formed on the substrate 101. Forming of the active device level 104 includes forming the access transistor 108. The active device level 104 may be formed using conventional FEOL-processing.

Following the FEOL-processing the structure may be subjected to BEOL-processing including forming of the first interconnection level 110 on the active device level 104. The first interconnection level 110 may be formed using conventional damascene or dual damascene-type processing.

The MTJ device 140 is then formed on the top surface of the finished first interconnection level 110. The MTJ device 140 is formed in the second region 100b of the device 100. The bottom electrode 142 of the MTJ device 140 is formed on the bottom electrode contact portion formed by the line segment 116 of the first interconnection level 110. The bottom electrode 142 may be formed by a layer of Ta, Ti, TaN, TiN, or combinations thereof. The bottom electrode material may be formed in for instance a sputtering or evaporation process.

The MTJ structure 144 is then formed on the bottom electrode 144 by forming a stack including a reference layer, a tunnel barrier layer and a free layer. A pinning layer may be formed above or below the reference layer depending on whether the MTJ structure 144 is to form a top-pinned or bottom-pinned MTJ structure. The reference layer and the free layer may each be formed by a ferromagnetic material. Examples of ferromagnetic materials include Fe, Co, FeB, CoB, CoFe and CoFeB. The reference layer and the free layer may also have a multi-layer structure including combinations of the afore-mentioned materials, and optionally also sub-layers of non-ferromagnetic materials. The tunnel barrier layer may include a layer of a dielectric material, for instance MgO, $AlO_x$, $MgAlO_x$ or $MgTiO_x$. Each of the layers of the MTJ structure 144 may be formed in for instance a respective sputtering or evaporation process.

The top electrode 146 is then formed on the MTJ structure 144. The top electrode 146 may be formed by a Ru-layer, in for instance a sputtering or evaporation process.

The material layers for forming the MTJ device 140 may be deposited as a stack of blanket layers on the first interconnection level 140. A mask layer may be formed above the layer stack including a mask portion defining the position and dimension of the MTJ device 140. The mask layer may be defined by patterning and developing a resist-based mask layer. It should be noted that the mask layer may be defined to include one mask portion for each MTJ which is to be formed. The pattern formed by the mask portion(s) may subsequently be transferred into the stack of blanket layers to form one or more pillar-shaped MTJ devices 140 in an etching process.

As indicated in FIG. 3a, the MTJ device 140 is formed with a height h corresponding to a desired thickness of the second interconnection level 120, which is to be formed. Alternatively, the MTJ device 140 may be formed with a height h which is less than the desired thickness of the second interconnection level 210.

With reference to FIG. 3b, a dielectric layer 122 is formed to cover the first interconnection level 110. A pattern is formed in the dielectric layer 122 for defining positions of the second set of conductive paths 121 of the second interconnection level 120.

On a first portion of the first interconnection level 110, in the region 100a of the device 100, the pattern includes trenches 324 and holes 323 defining positions of conductive lines and vias.

On a second portion of the first interconnection level 110, in the region 100b of the device 100, the pattern includes a hole 350 defining a position of a lower via portion of the multi-level via 150, which is to be formed. The hole 350 is formed above the line segment 118 which will form the first via contact portion for the multi-level via 150. The pattern in the dielectric layer 122 is filled with a conductive material 360. The conductive material 360 may be formed in an electro-plating process. The conductive material 360 may include Cu or Al. The conductive material 360 may as indicated cover a top surface of the dielectric layer 122. However, a partial filling of the pattern with the conductive material 360 is also possible.

A polishing process P may subsequently be applied to the conductive material 360 and the dielectric layer 122, thereby reducing a thickness of the dielectric layer 122 and the conductive material 360. The polishing process P may be performed until the desired thickness of the dielectric layer 122 is reached. In FIG. 3b this results in the conductive material 360 becoming coplanar with the top surface of the top electrode 246 of the MTJ device 140.

FIG. 3c illustrates the structure after the polishing process P is finished, wherein the second interconnection level 120 has been formed. The top surfaces of the second set of conductive paths 121 (including the line 124), the top electrode 146 and the lower via portion 350a are coplanar with each other and touch the interface 120 towards the third interconnection level 130 which is to be formed.

The third interconnection level 130 may then be formed in a manner similar to the second interconnection level 120 to arrive the device structure shown in FIG. 1. The upper via portion 150b of the multi-level via 150 may accordingly be formed by forming a conventional single-level via with the lower via portion 150a, during the process for forming the third interconnection level 130.

If the MTJ device 140 is formed with a height h which is less than the desired thickness of the second interconnection level 210, the forming of the third interconnection level may include forming of an extended hole, extending into the dielectric layer 122 to expose a top surface of the top electrode 146. A top electrode contact portion may hence be formed by a via portion in the second interconnection level 120, which via portion may be further connected to the set of conductive paths of the third interconnection level.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A magnetoresistive memory device, comprising:
    a first interconnection level including a first dielectric layer and a first set of conductive paths arranged in the first dielectric layer;
    a second interconnection level arranged on the first interconnection level and including a second dielectric layer and a second set of conductive paths arranged in the second dielectric layer;
    a third interconnection level arranged on the second interconnection level and including a third dielectric layer and a third set of conductive paths arranged in the third dielectric layer,
    wherein each of the first, second and third sets of conductive paths includes at least one horizontal line segment and a contacting vertical via arranged vertically within a respective one of the first, second and third interconnection levels;
    a magnetic tunnel junction (MTJ) device including a bottom layer, a top layer and an MTJ structure arranged between the bottom layer and the top layer, wherein the bottom layer is connected to a bottom layer contact portion of the first set of conductive paths and the top layer is connected to a top layer contact portion of the second or third set of conductive paths; and
    a multi-level via extending through the second and third dielectric layers and extending between a first via contact portion of the first set of conductive paths and a second via contact portion of the third set of conductive paths, wherein the height of the MTJ device corresponds to, or-is less than, the height of the multi-level via.

2. The device according to claim 1, wherein the multi-level via includes a lower via portion arranged in the second dielectric layer and an upper via portion arranged in the third dielectric layer, wherein the lower via portion extends through the second dielectric layer to an interface between the second interconnection level and the third interconnection level, and wherein the upper via portion extends from the interface to the second via contact portion of the third set of conductive paths.

3. The device according to claim 1, wherein the height of the MTJ device corresponds to, or is less than a height of the second interconnection level.

4. The device according to claim 1, wherein a top surface of the top layer of the MTJ device is coplanar with the top surface of the second set of conductive paths.

5. The device according to claim 1, wherein the bottom layer contact portion is formed by a line segment of the first set of conductive paths, the line segment being arranged on a via of the first set of conductive paths.

6. The device according to claim 1, wherein the top layer contact portion is formed by a via of the third set of conductive paths, the via being arranged below a line segment of the third set of conductive paths.

7. The device according to claim 1, wherein the first via contact portion is formed by a line segment of the first set of conductive paths, the line segment being arranged on a via of the first set of conductive paths.

8. The device according to claim 1, wherein the second via contact portion is formed by a line segment of the third set of conductive paths.

9. The device according to claim 1, further comprising an access transistor comprising a drain contact electrically connected to the bottom layer of the MTJ device by the bottom layer contact portion, the access transistor further comprising a source contact electrically connected to the multi-level via by the first via contact portion.

10. The device according to claim 9, wherein the top layer contact portion is connected to a bit line of the third set of conductive paths.

11. The device according to claim 1, further comprising a second MTJ device including a bottom layer, a top layer and an MTJ structure arranged between the bottom layer and the top layer,
wherein each of the bottom layer of the MTJ device and the bottom layer of the second MTJ device is electrically connected to the multi-level via by a respective access transistor.

12. The device according to claim 11, wherein the first via contact portion is formed by a line segment of a first source line of the first set of conductive paths of the first interconnection level and the second via contact portion is formed by a line segment of a second source line of the third set of conductive paths of the third interconnection level.

13. The device according to claim 12, further comprising a plurality of parallel first source lines of the first set of conductive paths, wherein the MTJ device and the second MTJ device are arranged between a pair of the first source lines, and wherein the multi-level via is arranged at a position, along one of the source lines, between the MTJ device and the second MTJ device.

14. A magnetoresistive memory device, comprising:
at least three interconnection levels formed above a substrate, wherein each of the at least three interconnection levels comprises a plurality of metal line segments, each of the line segments being formed on and contacting a via;
a magnetic tunnel junction (MTJ) device formed in an intermediate interconnection level formed between an upper interconnection level and a lower interconnection level, wherein the MTJ device contacts a first via of the upper interconnection level and a first metal line segment of the lower interconnection level, wherein the first metal line segment electrically contacts a drain of an access transistor; and
a multilevel via comprising a via of the intermediate interconnection level directly contacting a second via of the upper interconnection level, such that the multilevel via directly contacts a second metal line segment of the lower interconnection level and a first metal line segment of the upper interconnection level without contacting a metal line segment of the intermediate interconnection level, wherein the second metal segment of the lower interconnection level electrically contacts a source of the access transistor.

15. The magnetoresistive memory device of claim 14, wherein the MTJ device comprises an MTJ stack interposed between an upper electrode and a lower electrode, wherein the MTJ stack comprises a magnetic fixed layer and a magnetic free layer interposed by a tunnel barrier, wherein the upper electrode is formed by one of the metal line segments of the second metallization level.

16. The magnetoresistive memory device of claim 15, further comprising a second MTJ device adjacent to the MTJ device, wherein the second metal line segment of the lower interconnection level commonly electrically connects the source of the access transistor and a source of a second access transistor coupled to the second MTJ device.

17. The magnetoresistive memory device of claim 16, wherein lateral positions of the MTJ device, the second MTJ device and the multilevel via form an isosceles triangle.

18. The magnetoresistive memory device of claim 17, wherein none of the metal line segments of the intermediate interconnection level is formed laterally between the MTJ device and the second MTJ device.

* * * * *